United States Patent
Park et al.

(10) Patent No.: US 9,583,721 B2
(45) Date of Patent: Feb. 28, 2017

(54) SUBSTRATE FOR ORGANIC ELECTRONIC DEVICE

(71) Applicant: LG CHEM, LTD., Seoul (KR)

(72) Inventors: Min Choon Park, Daejeon (KR); Yeon Keun Lee, Daejeon (KR); Yong Sik Ahn, Seoul (KR); Jung doo Kim, Daejeon (KR); Sang Jun Park, Daejeon (KR); Yong Nam Kim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 14/492,730

(22) Filed: Sep. 22, 2014

(65) Prior Publication Data
US 2015/0008424 A1    Jan. 8, 2015

Related U.S. Application Data (63) Continuation of application No. PCT/KR2013/002704, filed on Apr. 1, 2013.

(30) Foreign Application Priority Data

Mar. 30, 2012  (KR) .................. 10-2012-0033515
Jul. 31, 2012  (KR) .................. 10-2012-0084216

(51) Int. Cl.
  *H01L 51/50*   (2006.01)
  *H01L 51/00*   (2006.01)
  *H01L 51/52*   (2006.01)
  *G02B 5/02*    (2006.01)

(52) U.S. Cl.
CPC ......... *H01L 51/0096* (2013.01); *G02B 5/0221* (2013.01); *G02B 5/0242* (2013.01); *H01L 51/5268* (2013.01); *H01L 51/5275* (2013.01); *H01L 2251/5369* (2013.01); *Y02E 10/549* (2013.01)

(58) Field of Classification Search
CPC .. H01L 51/0096; H01L 51/52; H01L 51/5268; H01L 2251/5369
See application file for complete search history.

(56) References Cited

U.S. PATENT DOCUMENTS 8,975,814 B2    3/2015 Takai et al.
2005/0271873 A1* 12/2005 Kameyama .......... G02B 5/3033
                                                  428/343

(Continued)

FOREIGN PATENT DOCUMENTS

CN    101790899 A    7/2010
EP    2551929 A1    1/2013

(Continued)

OTHER PUBLICATIONS

"Fundamentals of Liquid Crystal Displays—How They Work and What They Do", Fujitsu (2006): pp. 1-13. (Retrieved from http://www.fujitsu.com/downloads/    MICRO/fma/pdf/LCD_Backgrounder.pdf).*

*Primary Examiner* — Michele Fan
(74) *Attorney, Agent, or Firm* — Dentons US LLP (57) ABSTRACT

Provided are a substrate for an organic electronic device, an organic electronic device and lighting. As a substrate for an OED such as an OLED, a substrate capable of providing an organic electronic system having excellent performance and reliability may be provided.

15 Claims, 8 Drawing Sheets

(56) References Cited

U.S. PATENT DOCUMENTS

| | | | |
|---|---|---|---|
| 2006/0165918 A1* | 7/2006 | Ito | G02B 5/3016 428/1.31 |
| 2007/0195431 A1* | 8/2007 | Asakura | G02B 1/111 359/707 |
| 2008/0012478 A1* | 1/2008 | Hung | H01L 25/048 313/504 |
| 2009/0051277 A1* | 2/2009 | Inoue | B82Y 20/00 313/504 |
| 2012/0228601 A1 | 9/2012 | Hiyama et al. | |
| 2013/0011617 A1* | 1/2013 | Tasaki | B29C 45/14 428/148 |
| 2013/0026461 A1 | 1/2013 | Nakamura | |
| 2013/0069524 A1* | 3/2013 | Takai | G02B 5/0242 313/504 |
| 2013/0154043 A1* | 6/2013 | Kato | C08G 73/026 257/432 |
| 2015/0299512 A1 | 10/2015 | Kato et al. | |

FOREIGN PATENT DOCUMENTS

| | | | | |
|---|---|---|---|---|
| EP | 2628769 A1 | 8/2013 | | |
| JP | 2007066886 A | 3/2007 | | |
| JP | 2007335253 A | 12/2007 | | |
| JP | 2008066027 A | 3/2008 | | |
| JP | 2009004274 A | 1/2009 | | |
| JP | 2009076452 A | 4/2009 | | |
| JP | 2010129184 A | 6/2010 | | |
| JP | 2010182449 A | 8/2010 | | |
| JP | 2010231155 A | 10/2010 | | |
| JP | 2011148668 A | 8/2011 | | |
| JP | 2011154809 A | 8/2011 | | |
| JP | WO 2011118108 A1 * | 9/2011 | ............ | B29C 45/14 |
| JP | 2011209676 A * | 10/2011 | | |
| JP | WO 2011152275 A1 * | 12/2011 | ........... | G02B 5/0242 |
| JP | WO 2012026451 A1 * | 3/2012 | ........... | C08G 73/026 |
| KR | 1020100063729 A | 6/2010 | | |
| TW | 201203649 | 1/2012 | | |
| WO | 2009107043 A1 | 9/2009 | | |
| WO | 2011062215 A1 | 5/2011 | | |
| WO | 2011126097 A1 | 10/2011 | | |

* cited by examiner

SUBSTRATE FOR ORGANIC ELECTRONIC DEVICE

This application is a bypass continuation application of International Application No. PCT/KR2013/002704, filed on Apr. 1, 2013, which claims priority to and the benefit of Korean Patent Application Nos. 10-2012-0033515, filed Mar. 30, 2012 and 10-2012-0084216, filed Jul. 31, 2012, the disclosures of which are incorporated herein by reference in their entirety.

FIELD

The present application relates to a substrate for an organic electronic device (OED) and an OED.

BACKGROUND

An OED is a device exhibiting a function through exchange of charges between an electrode layer and an organic material. The OED includes an organic light emitting diode (OLED), an organic solar cell, an organic photo conductor (OPC), and an organic transistor.

Conventionally, an OLED, which is a representative OED, sequentially includes a substrate, a first electrode layer, an organic layer, and a second electrode layer.

In a structure known as a bottom emitting device, the first electrode layer may be a transparent electrode layer, and the second electrode layer may be a reflective electrode layer. In addition, in a structure known as a top emitting device, the first electrode layer may be formed as a reflective electrode layer, and the second electrode layer may be formed as a transparent electrode layer.

Electrons and holes injected by the electrode layers are recombined in the emitting layer located in the organic layer, resulting in generating light. The light may be emitted to the substrate in the bottom emitting device, or to the second electrode layer in the top emitting device.

In the structure of the OLED, indium tin oxide (ITO) generally used as the transparent electrode layer, the organic layer, and the substrate, which is conventionally formed of glass, have refractive indexes of approximately 2.0, 1.8, and 1.5, respectively. In such a relationship of the refractive index, for example, the light generated in the emitting layer in the bottom emitting device is trapped at an interface between the organic layer and the first electrode layer or in the substrate due to a total internal reflection phenomenon, and only a very small amount of light is emitted.

DESCRIPTION

Object

The present application is directed to providing a substrate for an OED, and an OED.

Solution

Figure 1:
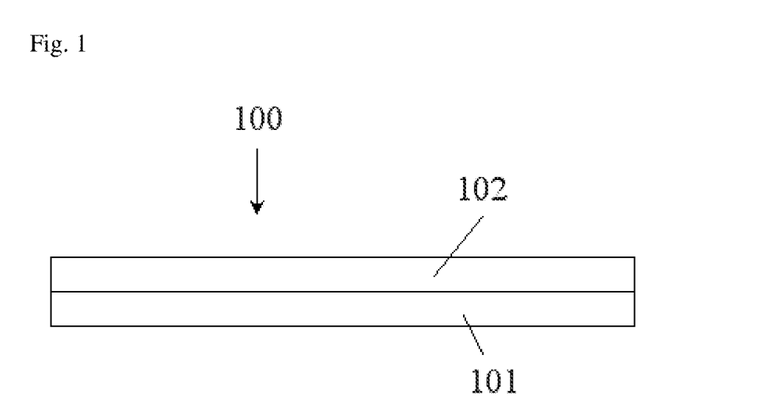
FIGS. 1 and 2 are schematic diagrams of illustrative substrates.

One aspect of the present application provides an illustrative substrate for an OED, including: a base layer, and a high refractive layer. The term "high refractive layer" used herein may refer to a layer having a refractive index of approximately 1.8 to 2.5. The term "refractive index" used herein may refer to, unless particularly defined otherwise, a refractive index with respect to light having a wavelength of approximately 550 to 633 nm. The high refractive layer may be, for example, formed on the base layer. FIG. 1 shows an illustrative substrate 100 including a base layer 101 and a high refractive layer 102 formed thereon. The high refractive layer may be, for example, a planarized layer. The term "planarized layer" used herein may refer to a layer capable of providing a planarized surface on which an OED may be formed. For example, the planarized layer may provide a surface having a maximum height roughness of 1 or 0.5 μm or less. The maximum height roughness may refer to a distance between a straight line passing the maximum point of a roughness curve and a straight line passing the minimum point thereof and parallel to a central line in the roughness curve within a cut off, which may be a value measured with respect to an arbitrary region having an area of 100 μm$^2$ on the planarized surface.

As the base layer, a suitable material may be used without particular limitation. For example, in a bottom emitting OLED, a transparent base layer, for example, a base layer having a transmittance with respect to light in a visible region of 50% or more may be used. As the transparent base layer, a glass base layer or a transparent polymer base layer may be used. As the glass base layer, a base layer including soda lime glass, barium/strontium-containing glass, lead glass, alumino silicate glass, borosilicate glass, barium borosilicate glass, or quartz may be used, and as the polymer base layer, a base layer including polyimide (PI), polyethylene naphthalate (PEN), polycarbonate (PC), an acryl resin, poly (ethylene terephthalate) (PET), poly(ether sulfide) (PES), or polysulfone (PS) may be used, but the present application is not limited thereto. As needed, the base layer may be a TFT substrate having a drive TFT.

For example, in a top emitting device, a base layer may not necessarily be a transparent base layer. When necessary, a reflective base layer in which a reflective layer is formed using aluminum on a surface of the base layer may be used.

For example, the high refractive layer may include a binder and particles. As described above, the high refractive layer may be a planarized layer providing a surface on which an OED including an electrode layer may be formed. The high refractive layer may also embody excellent light extraction efficiency through interaction with a scattering layer to be described later in some cases. The high refractive layer may have, for example, the same refractive index as that of an adjacent electrode layer, which may be approximately 1.8 to 2.5, 1.85 to 2.5, 1.9 to 2.2, or 2.2 to 2.5.

As the binder included in the high refractive layer, a known material may be used without particular limitation. As the binder, for example, various organic binders, inorganic binders, and organic/inorganic binders known in the art may be used. As the binder, one of the known materials having a refractive index of approximately 1.4, 1.45, 1.5, 1.6, 1.65 or 1.7 or more may be used. The upper limit of the refractive index of the binder may be selected in the range capable of satisfying the refractive index of the high refractive layer in consideration of a refractive index of the particles blended therewith. An inorganic or organic/inorganic binder having excellent thermal and chemical resistances may be used in consideration of a life span of the device or excellent resistance to a high temperature process, photolithography process or etching process, which is performed during a manufacturing process, but when necessary, an organic binder may also be used. The binder may be, for example, a heat or photo curable monomeric, oligomeric, or polymeric organic material including polyimide, a caldo resin having a fluorene ring, urethane, epoxide, polyester, or acrylate, an inorganic material such as silicon oxide, silicon nitride, silicon oxynitride, or polysiloxane, or an organic/inorganic combination material.

The binder may include polysiloxane, poly(amic acid) or polyimide. Here, the polysiloxane may be formed by polycondensating, for example, a condensable silane compound or siloxane oligomer, and the binder may form a matrix based on a bond (Si—O) between silicon and oxygen. During the formation of the binder, the binder matrix based on the bond (Si—O) between silicon and oxygen may be formed by controlling condensation conditions, or a matrix in which some of organic groups such as an alkyl group or condensable functional groups such as an alkoxy group remain may be formed.

The poly(amic acid) or polyimide binder may have a refractive index with respect to light having a wavelength of 633 nm of, for example, approximately 1.5, 1.6, 1.65 or 1.7 or more. Such a high refractive poly(amic acid) or polyimide may be prepared using, for example, a monomer to which a halogen atom other than fluorine, a sulfur atom or a phosphorus atom is introduced. For example, poly(amic acid) having a part capable of binding with particles such as a carboxyl group to enhance dispersion stability of the particles may be used. For example, the poly(amic acid) may be a compound including a repeating unit of Formula 1.

10,000 to 100,000 or 10,000 to 50,000. The poly(amic acid) having the repeating unit of Formula 1 may also have light transmittance in a visible region of 80, 85, or 90% or more, and have excellent thermal resistance.

As the binder, a high refractive binder or a lowly refractive binder may be used. The terms "high refractive binder" used herein may refer to a binder having a refractive index of approximately 1.7 to 2.5 or 1.7 to 2.0, and "lowly refractive binder" may refer to a binder have a refractive index of approximately equal to or more than 1.4 to less than 1.7. Various binders described above are known in the art, and a suitable binder may be selected from the above-described various kinds or other known binders.

The high refractive layer may include high refractive particles, for example, particles having a refractive index of, for example, more than 2.3, 2.35, 2.4, 2.5, 2.6 or 2.7 or more, as well as the binder. The upper limit of the refractive index of the high refractive particles may be selected in the range capable of satisfying a desired refractive index of the light scattering layer in consideration of the refractive index of the binder blended therewith. The high refractive particles may have an average diameter of, for example, approxi-

[Formula 1]

In Formula 1, n is a positive number.

The repeating unit may be optionally substituted with at least one substituent. As the substituent, a halogen atom other than fluorine, or a functional group including a halogen atom, a sulfur atom or a phosphorus atom such as a phenyl group, a benzyl group, a naphthyl group or a thiophenyl group may be used.

The poly(amic acid) may be a homopolymer formed using only the repeating unit of Formula 1, or a copolymer including another unit with the repeating unit of Formula 1. In the copolymer, the kind or ratio of another repeating unit may be suitably selected in the range in which, for example, a desired refractive index, thermal resistance or light transmittance is not inhibited.

As a particular example of the repeating unit of Formula 1, a repeating unit of Formula 2 may be used.

mately 1 to 100, 10 to 90, 20 to 80, 30 to 70, 30 to 60, or 30 to 50 nm. As the high refractive particles, a rutile titanium oxide may be used, but various particles may also be used, other than the above-described one satisfying the range of the refractive index.

The high refractive layer may include the particles at 300, 250, or 200 parts by weight or less with respect to 100 parts by weight of the binder. The lower limit of the ratio of the particles may be, for example, 40, 60, 80, 100, 120, 140 or 160 parts by weight or more. Unless particularly defined otherwise, the unit "parts by weight" used herein refers to a ratio of weights between components. When an OED is formed by maintaining a ratio between the binder and the particles as described above, the device having excellent performance and reliability may be provided by increasing external quantum efficiency, preventing penetration of a gas

[Formula 2]

In Formula 2, n is a positive number.

The poly(amic acid) may have a weight average molecular weight converted by standard polystyrene measured by gel permeation chromatography (GPC) of approximately or moisture from an external environment, and reducing outgassing. However, the content of the high refractive particles in the high refractive layer may also be controlled by the refractive index of the binder blended therewith. For example, when the above-described high refractive binder is used as a binder, the high refractive particles may be included at 180, 160, 150 or 120 parts by weight, or 80 to 150, 80 to 140, 80 to 130, or 90 to 120 parts by weight with respect to 100 parts by weight of the binder. In addition, when the lowly refractive binder is used as a binder, the high refractive particles may be included at 180 to 200 parts by weight with respect to 100 parts by weight of the binder. Within the range of the ratio as described above, the high refractive layer may have more excellent physical properties.

The high refractive layer may further include particles having a refractive index of approximately 2.0 or more, approximately 2.0 to 2.35 or 2.0 to 2.3 (hereinafter, referred to as "second particles") along with the particles having a refractive index of more than 2.3 (hereinafter, referred to as "first particles"). The second particles may have an average diameter, for example, similar to that of the first particle. As the second particles, alumina, alumino silicate, titanium oxide or zirconium oxide, for example, anatase-type titanium oxide, may be used.

When the first and second particles are simultaneously included in the high refractive layer, a ratio (A/B) of a weight (A) of the first particles and a weight (B) of the second particles may be, for example, approximately 0.1 to 1.5 or 0.5 to 1.0, and in the above range, the high refractive layer may exhibit suitable physical properties.

A thickness of the high refractive layer is not particularly limited, and may be controlled within a suitable range as needed.

Figure 2:
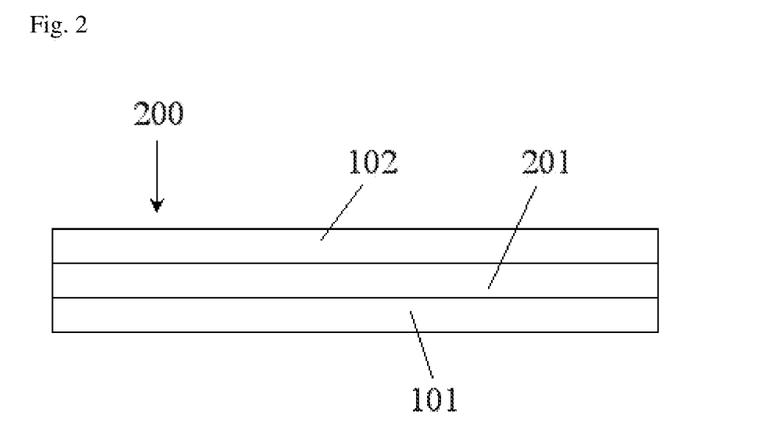

The substrate may further include a scattering layer, for example, between the base layer and the high refractive layer. FIG. 2 shows an illustrative substrate 2 further including a scattering layer 201 between a base layer 101 and a high refractive layer 102. The scattering layer is a layer capable of increasing light extraction efficiency, which may be formed using known material and structure that serve to scatter incident light.

Figure 3:
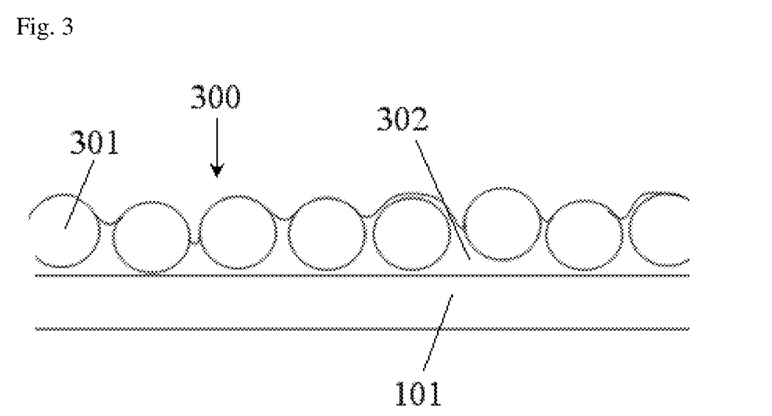
FIGS. 3 and 4 are cross-sectional views of illustrative scattering layers.

In one example, the scattering layer may be a layer including scattering particles. FIG. 3 shows an illustrative scattering layer 300 including scattering particles 301, which is formed on a base layer 101. The scattering layer 300 shown in FIG. 3 may include scattering particles 301 and a binder 302.

The term "scattering particles" used herein may refer to, for example, particles capable of scattering incident light since they have a refractive index different from that of a surrounding medium such as a binder for forming a scattering layer or the high refractive layer and a suitable size. As such particles, particles having a refractive index of, for example, approximately 1.0 to 2.0, 1.2 to 1.8, 2.1 to 3.5 or 2.2 to 3.0, and an average diameter of approximately 50 to 20,000 or 100 to 5,000 nm. The scattering particles may have a spherical, oval, polygonal or amorphous shape, but the shape thereof is not particularly limited thereto. The scattering particles may include, for example, an organic material such as polystyrene or a derivative thereof, an acrylic resin or a derivative thereof, a silicon resin or a derivative thereof, or a novolac resin or a derivative thereof, or an inorganic material such as silica, alumina, titanium oxide or zirconium oxide. The scattering particles may include any one of the above materials, or at least two thereof, or may be formed in core/shell-type particles or hollow-type particles as needed.

The scattering layer may further include a binder maintaining the scattering particles. As a binder, for example, as a material capable of maintaining the scattering particles, another adjacent material such as a material having the same refractive index as the base layer may be used. As a binder, for example, suitable one may be selected from a range of binders which may be used to form the high refractive layer, and another known material may also be used when necessary.

Figure 4:
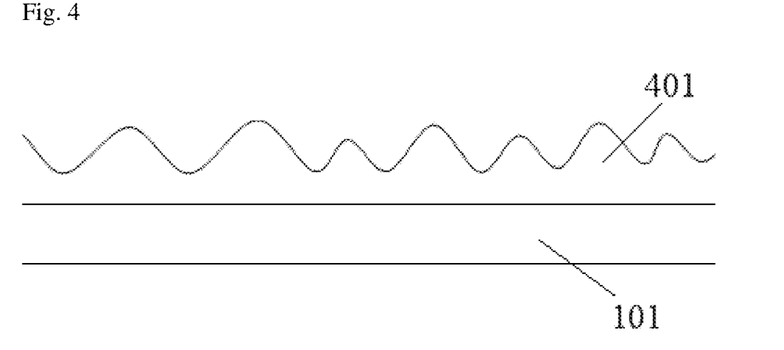

The scattering layer may be, for example, a layer having an uneven structure. FIG. 4 is a diagram showing that a scattering layer 401 having an uneven structure is formed on a base layer 101. When the uneven structure of the scattering layer is suitably controlled, incident light may be scattered.

The scattering layer having an uneven structure may be formed, for example, by coating a heat- or photo-curable material, and curing the material in contact with a mold capable of transferring a desired shape of the uneven structure during curing or performing an etching process. In another method, the scattering layer may be formed by blending particles having a suitable size and shape in a binder for forming the scattering layer. In this case, the particles may not need to be particles having a scattering function, but particles having a scattering function may also be used.

For example, the scattering layer may be formed by coating a material by wet coating, and performing application of heat or irradiation of light, curing of the material by a sol-gel method, deposition such as chemical vapor deposition (CVD) or physical vapor deposition (PVD), or microembossing.

The substrate may further include an electrode layer. For example, the electrode layer may be formed on the high refractive layer. As the electrode layer, for example, a conventional hole injection or electron injection electrode layer used to manufacture an OED such as an OLED may be formed.

The hole injection electrode layer may be formed using a material having, for example, a relatively high work function, and when necessary, using a transparent material. For example, the hole injection electrode layer may include a metal, an alloy, an electric conductive compound having a work function of approximately 4.0 eV or more, or a mixture of at least two thereof. Such a material may be a metal such as gold, CuI, ITO, indium zinc oxide (IZO), zinc tin oxide (ZTO), aluminum or indium-doped zinc oxide, magnesium indium oxide, nickel tungsten oxide, an oxide material such as ZnO, $SnO_2$ or $In_2O_3$, a metal nitride such as gallium nitride, a metal selenide such as zinc selenide, or a metal sulfide such as zinc sulfide. A transparent hole injection electrode layer may also be formed using a stacked structure of a metal thin film such as Au, Ag, or Cu and a high refractive transparent material such as ZnS, $TiO_2$, or ITO.

The hole injection electrode layer may be formed by an arbitrary means such as deposition, sputtering, chemical deposition, or an electrochemical means. In addition, as needed, the formed electrode layer may be patterned through known photolithography or a process using a shadow mask. A thickness of the hole injection electrode layer may vary according to light transmittance or surface resistance, but may conventionally be 500 nm or in a range of 10 to 200 nm.

The transparent electron injection electrode layer may be formed using, for example, a transparent material having a relatively low work function, and for example, a suitable one of the materials used to form the hole injection electrode layer may be used, but the present application is not limited thereto. The electron injection electrode layer may be formed using, for example, deposition or sputtering, and when necessary, may be suitably patterned. The electron injection electrode layer may be formed to a suitable thickness as needed.

When the electrode layer is formed, the high refractive layer or the high refractive layer and the scattering layer (hereinafter, referred to as a "high refractive layer") may have a smaller projected area than that of the electrode layer. In this case, the high refractive layer may have a smaller projected area than that of the base layer. The term "projected area" used herein refers to a projected area of a target recognized when the substrate is observed from above or below in a direction parallel to the normal line of a surface thereof, for example, an area of the base layer, high refractive layer, scattering layer or electrode layer. Accordingly, for example, even though a substantial surface area is larger than that of the electrode layer because a surface of the high refractive layer or scattering layer is formed in an uneven shape, when an area recognized by observing the high refractive layer or scattering layer from above is smaller than that recognized by observing the electrode layer from above, it is construed that the high refractive layer or scattering layer has a smaller projected area than that of the electrode layer.

The high refractive layer and the like may be present in various types when they have a smaller projected area than those of the base layer and the electrode layer. For example, the as shown in FIG. 5 or 6, the high refractive layer 102 or the high refractive layer 102 and the scattering layer 201 may be formed only at a part of the base layer 101 other than an edge thereof, or a part of the high refractive layer may remain at the edge of the base layer.

Figure 5:
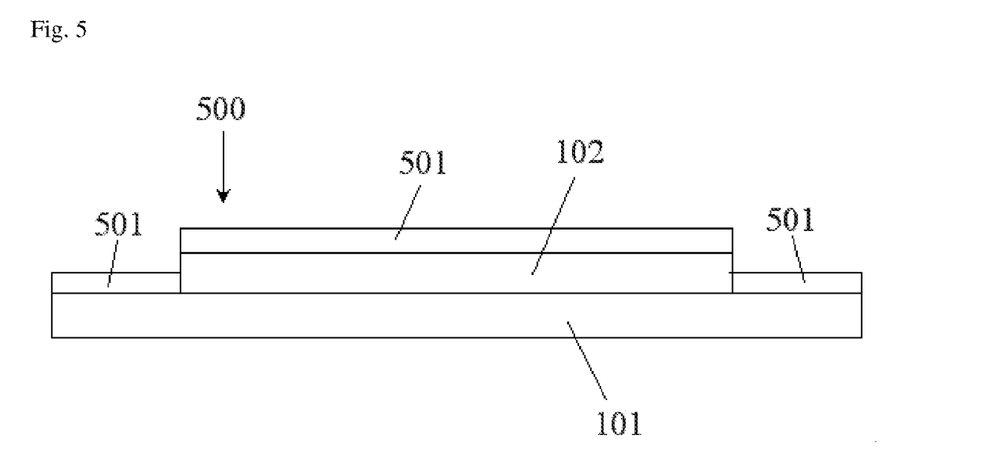
FIGS. 5 to 7 are schematic diagrams of illustrative substrates.
Figure 6:
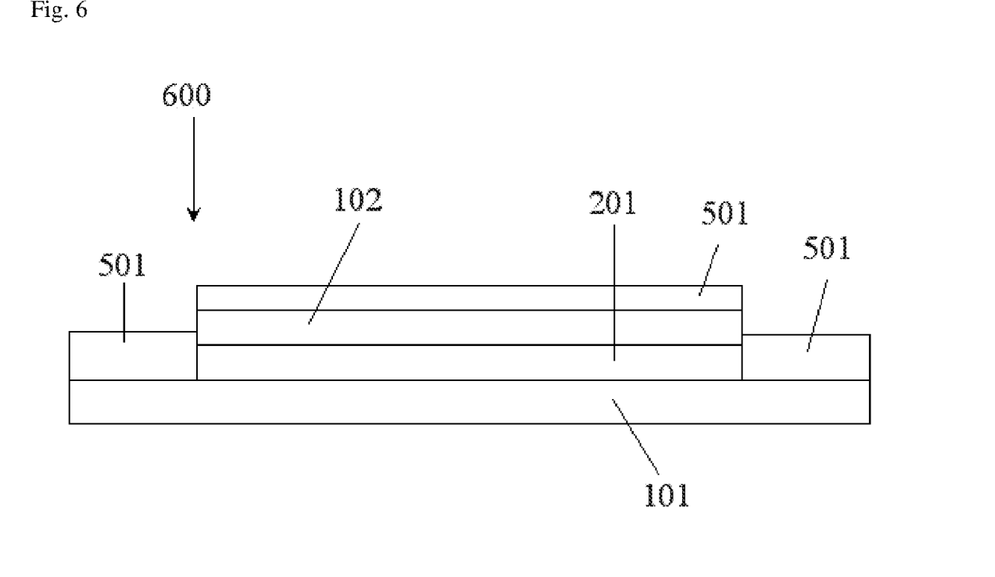
Figure 7:
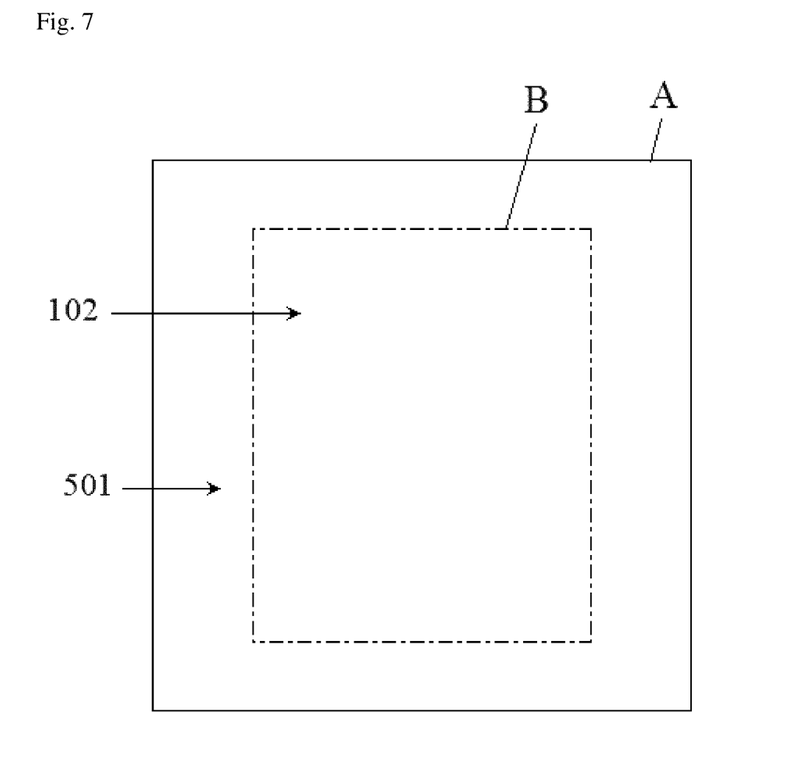

FIG. 7 is a diagram of the substrate of FIG. 5 when observed from above. As shown in FIG. 7, an area (A), that is, a projected area (A), of the electrode layer 501 recognized when the substrate is observed from above is larger than an area (B), that is, a projected area (B) of the scattering layer 102 disposed therebelow. A ratio (A/B) of the projected area (A) of the electrode layer 501 and the projected area (B) of the high refractive layer 102 or the scattering layer may be, for example, 1.04, 1.06, 1.08, 1.1, or 1.15 or more. When the projected area of the high refractive layer is smaller than that of the electrode layer, since an optical functional layer to be described later is possibly embodied not to be exposed to an external environment, the upper limit of the ratio (A/B) in projected area is not particularly limited. In consideration of a general environment of manufacturing a substrate, the upper limit of the ratio (A/B) may be, for example, approximately 2.0, 1.5, 1.4, 1.3 or 1.25. In the substrate, the electrode layer may be formed on the top of the base layer on which the high refractive layer is not formed. The electrode layer may be formed in contact with the base layer, or an additional component may be further included between the electrode layer and the base layer. According to such a structure, in the embodiment of the OED, a structure in which the high refractive layer is not exposed to an external environment may be embodied.

For example, as shown in FIG. 7, the electrode layer 501 may be formed in a region including a region beyond all of peripheral regions of the scattering layer 102 when observed from above. In this case, for example, when a plurality of high refractive layers are present on the base layer, the electrode layer may be formed up to the region including the region beyond all of the peripheral regions of at least one high refractive layer, for example, the scattering layer on which an organic layer will be formed at least the top thereof. In such a structure, a structure in which the high refractive layer and the like are not exposed to an external environment may be formed by attaching an encapsulating structure to be described later to an electrode layer below which the high refractive layer is not formed. Accordingly, penetration of external moisture or oxygen through the high refractive layer and the like may be prevented, adhesive strength between the encapsulating structure or the electrode and the substrate may be stably ensured, and a surface hardness at the edge of the device may be excellently maintained. To seal the high refractive layer and the like with an electrode and the substrate, an electrode is formed to cover the high refractive layer and the like in a deposition or sputtering process for forming an electrode. In this process, when necessary, a process of removing a predetermined part of the high refractive layer may be performed.

The substrate may further include, for example, an intermediate layer present between the high refractive layer and the electrode layer. For example, the intermediate layer may have a larger projected area than that of the high refractive layer, and may be formed on the top of the high refractive layer and the top of the base layer which does not have the high refractive layer. The intermediate layer may solve an increase in resistance of the electrode layer by reducing a step difference on the boundary between the electrode layer on the high refractive layer and the electrode layer on the base layer, which is formed by the high refractive layer having a smaller projected area than that of the electrode layer as described above. In addition, as the intermediate layer, when a material having a barrier property, that is, a low moisture or vapor penetration rate is used, a structure in which the high refractive layer is not exposed to an external environment may be more effectively embodied. The intermediate layer may be a layer having an absolute value of a difference in refractive index between the intermediate layer and the electrode layer of, for example, approximately 1, 0.7, 0.5, or 0.3 or less. When the refractive index is controlled as described above, for example, degradation of light extraction efficiency may be prevented by trapping light generated on the top of the electrode layer at an interface between the electrode layer and the intermediate layer. A material for forming the intermediate layer may be a material having a relationship of the refractive index with the electrode layer, and a barrier property when necessary. As such a material, various materials, for example, titanium oxide (TiOx) such as SiON or $TiO_2$, silicon oxide (SiOx) such as $SiO_2$, aluminum oxide (AlOx) such as $Al_2O_3$, another metal oxide such as $Ta_2O_3$, $Ti_3O_3$, TiO, $ZrO_2$, $Nb_2O_3$, $CeO_2$, ZnS or ZnO, or oxynitride may be used. The intermediate layer may be formed by a known method such as deposition such as PVD, CVD or ALD, sputtering, or wet coating. A thickness of the intermediate layer may be, but is not particularly limited to, for example, approximately 1 to 100, 10 to 100 or 20 to 80 nm. The thickness means an average thickness, and for example, the intermediate layer formed on the scattering layer and the intermediate layer formed on the high refractive layer may have different thicknesses.

Another aspect of the present application provides an organic electronic system. The illustrative organic electronic system of the present application may include the substrate for an OED described above, and an OED formed on the substrate, for example, a high refractive layer of the substrate. The OED may include, for example, a first electrode layer, an organic layer and a second electrode layer, which are sequentially formed on the high refractive layer. In one embodiment, the OED may be an OLED. When the OED is an OLED, the OED may have, for example, a structure in which an organic layer including at least an emitting layer is intermediated between a hole injection electrode layer and an electron injection electrode layer. The hole injection electrode layer or the electron injection electrode layer may be an electrode layer on the high refractive layer of the substrate described above.

In the OLED, the organic layer present between the electron and hole injection electrode layers may include at least one emitting layer. The organic layer may include multiple, that is, at least two emitting layers. When the at least two emitting layers are included, the emitting layers may have a structure split by an inter-electrode having a charge generating characteristic or a charge generating layer (CGL), but the present application is not limited thereto.

The emitting layer may be formed using, for example, various fluorescent or phosphorescent organic materials known in the art. An example of the material capable of being in the emitting layer may be, but is not limited to, a fluorescent material such as an Alq-based material such as tris(4-methyl-8-quinolinolate)aluminum(III) (Alg3), 4-MAlq3 or Gaq3; a cyclopenadiene derivative such as C-545T ($C_{26}H_{26}N_2O_2S$), DSA-amine, TBSA, BTP, PAPNPA, spiro-FPA, $Ph_3Si$ (PhTDAOXD), 1,2,3,4,5-pentaphenyl-1,3-cyclopentadiene (PPCP), 4,4'-bis(2,2'-diphenylyinyl)-1,1'-biphenyl (DPVBi), distyryl benzene or a derivative thereof, or 4-(dicyanomethylene)-2-tert-butyl-6-(1,1,7,7,-tetramethyljulolidyl-9-enyl)-4H-pyran (DCJTB), DDP, AAAP or NPAMLI; or a phosphorescent material such as Firpic, m-Firpic, N-Firpic, $bon_2Ir(acac)$, $(C_6)_2Ir(acac)$, $bt_2Ir(acac)$, $dp_2Ir(acac)$, $bzq_2Ir(acac)$, $bo_2Ir(acac)$, $F_2Ir(bpy)$, $F_2Ir(acac)$, $op_2Ir(acac)$, $ppy_2Ir(acac)$, $tpy_2Ir(acac)$, fac-tris[2-(4,5'-difluorophenyl)pyridine-C'2,N]iridium(III) (FIrppy) or bis(2-(2'-benzo[4,5-a]thienyl)pyridinato-N,C3') iridium(acetylactonate) ($Btp_2Ir(acac)$). The emitting layer may include the material as a host, and a host-dopant system including perylene, distyrylbiphenyl, DPT, quinacridone, rubrene, BTX, ABTX or DCJTB as a dopant.

The emitting layer may also be formed by employing one suitable type selected from electron accepting organic compounds and electron donating organic compounds exhibiting excellent emitting characteristics, which will be described later.

The organic layer may be formed in various structures further including various functional layers known in the art, as long as it includes the emitting layer. As a layer capable of being included in the organic layer, an electron injection layer, a hole blocking layer, an electron transport layer, a hole transport layer or a hole injection layer may be used.

The electron injection layer or electron transport layer may be formed using, for example, an electron accepting organic compound. Here, as the electron accepting organic compound, a known optional compound may be used without particular limitation. As such an organic compound, a polycyclic compound such as p-terphenyl or quaterphenyl or a derivative thereof; a polycyclic hydrocarbon compound such as naphthalene, tetracene, pyrene, coronene, chrysene, anthracene, diphenylanthracene, naphthacene, or phenanthrene or a derivative thereof; or a heterocyclic compound such as phenanthroline, bathophenanthroline, phenanthridine, acridine, quinoline, quinoxaline, or phenazine or a derivative thereof. In addition, fluoroceine, perylene, phthaloperylene, naphthaloperylene, perynone, phthaloperynone, naphthaloperynone, diphenylbutadiene, tetraphenylbutadiene, oxadiazole, aldazine, bisbenzoxazoline, bisstyryl, pyrazine, cyclopentadiene, oxine, aminoquinoline, imine, diphenylethylene, vinylanthracene, diaminocarbazole, pyrane, thiopyrane, polymethine, merocyanine, quinacridone, rubrene or a derivative thereof, a metal chelate complex compound disclosed in a patent publication such as Japanese Patent Application Laid-Open No. 1988-295695, Japanese Patent Application Laid-Open No. 1996-22557, Japanese Patent Application Laid-Open No. 1996-81472, Japanese Patent Application Laid-Open No. 1993-009470 or Japanese Patent Application Laid-Open No. 1993-017764, for example, a metal complex having at least one of metal chelated oxinoid compounds such as 8-quinolatos including tris(8-quinolinolato)aluminum, bis(8-quinolinolato)magnesium, bis[benzo(f)-8-quinolinolato]zinc, bis(2-methyl-8-quinolinolato)aluminum, tris(8-quinolinolato)indium, tris (5-methyl-8-quinolinolato)aluminum, 8-quinolinolatolithium, tris(5-chloro-8-quinolinolato)gallium, bis(5-chloro-8-quinolinolato)calcium and derivatives thereof as a coordinator; an oxadiazole compound disclosed in a patent publication such as Japanese Patent Application Laid-Open No. 1993-202011, Japanese Patent Application Laid-Open No. 1995-179394, Japanese Patent Application Laid-Open No. 1995-278124 or Japanese Patent Application Laid-Open No. 1995-228579; a triazine compound disclosed in a patent publication such as Japanese Patent Application Laid-Open No. 1995-157473; a stilbene derivative disclosed in a patent publication such as Japanese Patent Application Laid-Open No. 1994-203963; a distyrylarylene derivative; a styryl derivative disclosed in a patent publication such as Japanese Patent Application Laid-Open No. 1994-132080 or Japanese Patent Application Laid-Open No. 1994-88072, a diolefin derivative disclosed in a patent publication such as Japanese Patent Application Laid-Open No. 1994-100857 or Japanese Patent Application Laid-Open No. 1994-207170; a fluorescent brightening agent such as a benzooxazole compound, a benzothiazole compound or a benzoimidazole compound; a distyrylbenzene compound such as 1,4-bis(2-methylstyryl)benzene, 1,4-bis(3-methylstyryl)benzene, 1,4-bis(4-methylstyryl)benzene, distyrylbenzene, 1,4-bis(2-ethylstyryl)benzyl, 1,4-bis(3-ethylstyryl)benzene, 1,4-bis(2-methylstyryl)-2-methylbenzene or 1,4-bis(2-methylstyryl)-2-ethylbenzene; a distyrylpyrazine compound such as 2,5-bis(4-methylstyryl)pyrazine, 2,5-bis(4-ethylstyryl)pyrazine, 2,5-bis[2-(1-naphthyl)vinyl]pyrazine, 2,5-bis(4-methoxystyryl)pyrazine, 2,5-bis[2-(4-biphenyl)vinyl]pyrazine or 2,5-bis[2-(1-pyrenyl)vinyl]pyrazine; a dimethylidine compound such as 1,4-phenylenedimethylidene, 4,4'-phenylenedimethylidene, 2,5-xylene dimethylidene, 2,6-naphthylenedimethylidene, 1,4-biphenylenedimethylidene, 1,4-para-terephenylene dimethylidene, 9,10-anthracenediyldimethylidine, or 4,4'-(2,2-di-tibutylphenylvinyl)biphenyl, 4,4'-(2,2-diphenylvinyl) biphenyl or a derivative thereof; a silanamine derivative disclosed in a patent publication such as Japanese Patent Application Laid-Open No. 1994-49079 or Japanese Patent Application Laid-Open No. 1994-293778; a multifunctional styryl compound disclosed in a patent publication such as Japanese Patent Application Laid-Open No. 1994-279322 or Japanese Patent Application Laid-Open No. 1994-279323; an oxadiazole derivative disclosed in a patent publication such as Japanese Patent Application Laid-Open No. 1994-107648 or Japanese Patent Application Laid-Open No. 1994-092947; an anthracene compound disclosed in a patent publication such as Japanese Patent Application Laid-Open No. 1994-206865; an oxinate derivative disclosed in a patent publication such as Japanese Patent Application Laid-Open No. 1994-145146; a tetraphenyl butadiene compound disclosed in a patent publication such as Japanese Patent Application Laid-Open No. 1992-96990; an organic trifunctional compound disclosed in a patent publication such as Japanese Patent Application Laid-Open No. 1991-296595; a coumarin derivative disclosed in a patent publication such as Japanese Patent Application Laid-Open No. 1990-191694; a perylene derivative disclosed in a patent publication such as Japanese Patent Application Laid-Open No. 1990-196885; a naphthalene derivative disclosed in a patent publication such as Japanese Patent Application Laid-Open No. 1990-255789; a phthaloperynone derivative disclosed in a patent publication such as Japanese Patent Application Laid-Open No. 1990-289676 or Japanese Patent Application Laid-Open No. 1990-88689; or a styryl amine derivative disclosed in a patent publication such as Japanese Patent Application Laid-Open No. 1990-250292 may be used as an electron accepting organic compound included in a lowly refractive layer. In addition, here, the electron injection layer may be formed using, for example, a material such as LiF or CsF.

The hole blocking layer may be a layer capable of enhancing a life span and efficiency of the device by preventing approach of holes injected from a hole injection electrode to an electron injection electrode through the emitting layer, and may be formed in a suitable part between the emitting layer and the electron injection electrode using a known material when necessary.

The hole injection layer or hole transport layer may include, for example, an electron donating organic compound. As the electron donating organic compound, N,N', N'-tetraphenyl-4,4'-diaminophenyl, N,N'-diphenyl-N,N'-di(3-methylphenyl)-4,4'-diaminobiphenyl, 2,2-bis(4-di-p-tollylaminophenyl)propane, N,N,N',N'-tetra-p-tollyl-4,4'-diaminobiphenyl, bis(4-di-p-tollylaminophenyl)phenylmethane, N,N'-diphenyl-N,N'-di(4-methoxyphenyl)-4,4'-diaminobiphenyl, N,N,N',N'-tetraphenyl-4,4'-diaminodiphenylether, 4,4'-bis(diphenylamino)quadriphenyl, 4-N,N-diphenylamino-(2-diphenylvinyl)benzene, 3-methoxy-4'-N,N-diphenylaminostyrylbenzene, N-phenylcarbazole, 1,1-bis(4-di-p-triaminophenyl)cyclohexane, 1,1-bis(4-di-p-triaminophenyl)-4-phenylcyclohexane, bis(4-dimethylamino-2-methylphenyl)phenylmethane, N,N,N-tri(p-tollyl)amine, 4-(di-p-tollylamino)-4'-[4-(di-p-tollylamino)styryl]stilbene, N,N,N',N'-tetraphenyl-4,4'-diaminobiphenyl N-phenylcarbazole, 4,4'-bis[N-(1-naphthyl)-N-phenyl-amino]biphenyl, 4,4"-bis[N-(1-naphthyl)-N-phenylamino]p-terphenyl, 4,4'-bis[N-(2-naphthyl)-N-phenylamino]biphenyl, 4,4'-bis[N-(3-acenaphthenyl)-N-phenylamino]biphenyl, 1,5-bis[N-(1-naphthyl)-N-phenylamino]naphthalene, 4,4'-bis[N-(9-anthryl)-N-phenylamino]biphenylphenylamino]biphenyl, 4,4"-bis[N-(1-anthryl)-N-phenylamino]-p-terphenyl, 4,4'-bis[N-(2-phenanthryl)-N-phenylamino]biphenyl, 4,4'-bis[N-(8-fluoranthenyl)-N-phenylamino]biphenyl, 4,4'-bis[N-(2-pyrenyl)-N-phenylamino]biphenyl, 4,4'-bis[N-(2-perylenyl)-N-phenylamino]biphenyl, 4,4'-bis[N-(1-coronenyl)-N-phenylamino]biphenyl, 2,6-bis(di-p-tollylamino)naphthalene, 2,6-bis[di-(1-naphthyl)amino]naphthalene, 2,6-bis[N-(1-naphthyl)-N-(2-naphthyl)amino]naphthalene, 4,4"-bis[N,N-di(2-naphthyl)amino]terphenyl, 4,4-bis{N-phenyl-N-[4-(1-naphthyl)phenyl]amino}biphenyl, 4,4'-bis[N-phenyl-N-(2-pyrenyl)amino]biphenyl, 2,6-bis[N,N-di-(2-naphthyl)amino]fluorine or 4,4"-bis(N,N-di-p-tollylamino)terphenyl, or an aryl amine compound such as bis(N-1-naphthyl)(N-2-naphthyl)amine may be used, but the present application is not limited thereto.

The hole injection layer or hole transport layer may be formed by dispersing the organic compound in a polymer, or using a polymer derived from the organic compound. In addition, a π-conjugated polymer such as polyparaphenylenevinylene and a derivative thereof, a hole transport non-conjugated polymer such as poly(N-vinylcarbazole) or a σ-conjugated polymer of polysilane may also be used.

The hole injection layer may be formed using an electrically-conductive polymer such as a metal phthalocyanine such as copper phthalocyanine or a non-metal phthalocyanine, a carbon layer and polyaniline, or may be formed by reaction with a Lewis acid using the aryl amine compound as an oxidizing agent.

For example, the OLED may be formed in a type of (1) a hole injection electrode layer/an organic emitting layer/an electron injection electrode layer; (2) a hole injection electrode layer/a hole injection layer/an organic emitting layer/an electron injection electrode layer; (3) a hole injection electrode layer/an organic emitting layer/an electron injection layer/an electron injection electrode layer; (4) a hole injection electrode layer/a hole injection layer/an organic emitting layer/an electron injection layer/an electron injection electrode layer; (5) a hole injection electrode layer/an organic semiconductor layer/an organic emitting layer/an electron injection electrode layer; (6) a hole injection electrode layer/an organic semiconductor layer/an electron barrier layer/an organic emitting layer/an electron injection electrode layer; (7) a hole injection electrode layer/an organic semiconductor layer/an organic emitting layer/an adhesion-improving layer/an electron injection electrode layer; (8) a hole injection electrode layer/a hole injection layer/a hole transport layer/an organic emitting layer/an electron injection layer/an electron injection electrode layer; (9) a hole injection electrode layer/an insulating layer/an organic emitting layer/an insulating layer/an electron injection electrode layer; (10) a hole injection electrode layer/an inorganic semiconductor layer/an insulating layer/an organic emitting layer/an insulating layer/an electron injection electrode layer; (11) a hole injection electrode layer/an organic semiconductor layer/an insulating layer/an organic emitting layer/an insulating layer/an electron injection electrode layer; (12) a hole injection electrode layer/an insulating layer/a hole injection layer/a hole transport layer/an organic emitting layer/an insulating layer/an electron injection electrode layer or (13) a hole injection electrode layer/an insulating layer/a hole injection layer/a hole transport layer/an organic emitting layer/an electron injection layer/an electron injection electrode layer, which are sequentially formed from the high refractive layer of the substrate, and in some cases, the OLED may have an organic layer having a structure in which at least two emitting layers are split by an inter-electrode layer having a charge generating characteristic or CGL between a hole injection electrode layer and an electron injection electrode layer, but the present application is not limited thereto.

Various materials for forming a hole or electron injection electrode layer and an organic layer, for example, an emitting layer, an electron injection or transport layer, or a hole injection or transport layer and methods of forming the same are known in the art, and all of the above-described methods may be applied to manufacture the organic electronic system.

The organic electronic system may further include an encapsulating structure. The encapsulating structure may be a protective structure for preventing inflow of an external material such as moisture or oxygen to the organic layer of the organic electronic system. The encapsulating structure may be, for example, a can such as a glass can or a metal can, or a film covering an entire surface of the organic layer.

Figure 8:
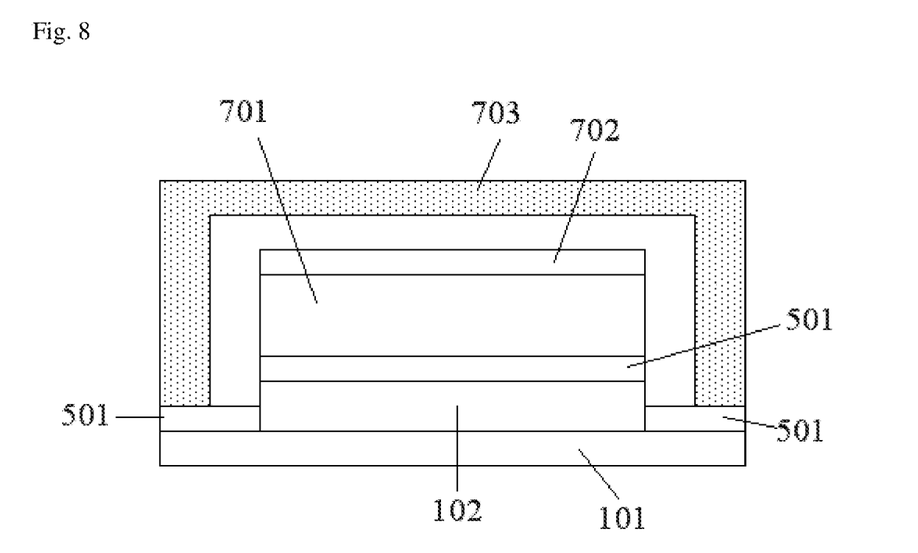
FIGS. 8 and 9 are diagrams of illustrative organic electronic systems.

FIG. 8 shows that an organic layer 701 and a second electrode layer 702 formed on a substrate including a base layer 101, a high refractive layer 102 and a first electrode layer 501, which are sequentially formed, are protected by an illustrative encapsulating structure 703 formed in a can structure such as a glass can or a metal can. For example, the encapsulating structure 703 may be attached by an adhesive. The encapsulating structure 703 may be adhered to the substrate, for example, the electrode layer 501 below which the high refractive layer 102 is not present. For example, the encapsulating structure 703 as shown in FIG. 8 may be attached to an end of the substrate by an adhesive. According to such a method, a protecting effect by the encapsulating structure may be optimized.

Figure 9:
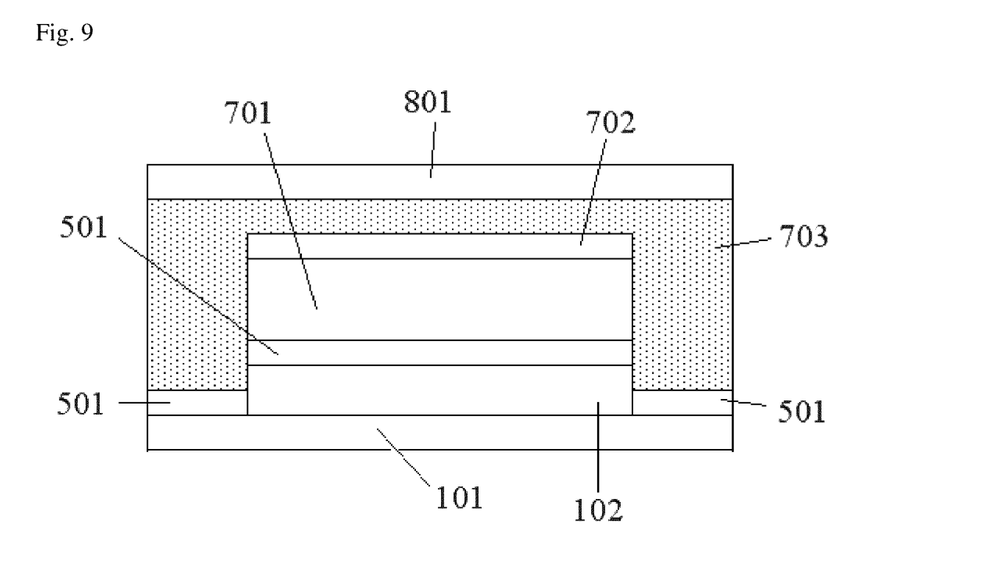

The encapsulating structure may be, for example, a film coating entire surfaces of an organic layer and a second electrode layer. FIG. 9 shows an illustrative film-type encapsulating structure 703 covering entire surfaces of an organic layer 701 and a second electrode layer 702. For example, as shown in FIG. 9, the film-type encapsulating structure 703 may cover the entire surfaces of the organic layer 701 and the second electrode layer 702, and have a structure in which the substrate including the base layer 101, the high refractive layer 102 and the electrode layer 501 is adhered to a second substrate 801 disposed thereon. For example, as the second substrate 801, a glass substrate, a metal substrate, a polymer film or a barrier layer may be used. The film-type encapsulating structure may be formed by, for example, coating a liquid material cured by heat or UV irradiation such as an epoxy resin and curing the liquid material, or laminating the substrate with the upper substrate using an adhesive sheet previously manufactured in a film type using the epoxy resin.

The encapsulating structure may include a water adsorbent or getter such as a metal oxide such as calcium oxide or beryllium oxide, a metal halide such as calcium oxide, or phosphorus pentoxide, when necessary. For example, the water adsorbent or getter may be included in the film-type encapsulating structure, or present at a predetermined position of a can-type encapsulating structure. The encapsulating structure may further include a barrier film or a conductive film.

As shown in FIG. 8 or 9, the encapsulating structure may be attached to, for example, the top of the first electrode layer 501 below which the high refractive layer 102 is not formed. Accordingly, a sealing structure in which the high refractive layer is not exposed to an external environment may be embodied. The sealing structure may refer to, for example, a state in which the entire surface of the high refractive layer is not exposed to an external environment by being surrounded by the base layer, the electrode layer and/or the encapsulating structure, or by being surrounded by the sealing structure formed to include the base layer, the electrode layer and/or the encapsulating structure. The sealing structure may be formed to only include the base layer, the electrode layer and/or the encapsulating structure, or to include the base layer, the electrode layer, the encapsulating structure, and also another component, for example, an auxiliary electrode as long as the high refractive layer is not exposed to an external environment. For example, in FIG. 8 or 9, another component may be present at a part in which the base layer 101 is in contact with the electrode layer 501 or the electrode 501 is in contact with the encapsulating structure 703 or another position. As the another component, an organic, inorganic or organic/inorganic combination material having a low water permeability, an insulating layer or an auxiliary electrode may be used.

Still another aspect of the present application provides a use of the organic electronic system, for example, the organic light emitting system. The organic light emitting system may be effectively applied to a backlight of a liquid crystal display (LCD), lightings, sensors, printers, a light source of a copy machine, a light source for an automobile gauge, a signal light, a pilot lamp, a display device, a light source for a planar emitting device, a display, decorations or other kinds of lights. In one embodiment, the present application relates to a lighting device including the OLED. When the OLED is applied to the lighting device or for different uses, other components constituting the device or a method of constituting the device is not particularly limited, but all of optional materials or methods known in the related art may be employed as long as these are used in the OLED.

Effect

According to the present application, as a substrate for an OED such as an OLED, a substrate capable of providing an organic electronic system having excellent performance and reliability can be provided.

DESCRIPTION OF THE MARKS 100, 200, 500, 600: the substrate for the organic electronic device
101: the base layer
102: the high refractive layer
201, 300, 401: the scattering layer
301: the scattering particle
302: the binder
501: the electrode layer, the first electrode layer
501: the organic layer
702: the second electrode layer
703: the encapsulating structure
801: the second substrate

ILLUSTRATIVE EMBODIMENTS

Hereinafter, illustrative embodiments of the present application will be described in detail. However, the present application is not limited to the embodiments disclosed below.

Example 1

A coating solution for a light scattering layer was prepared by blending and sufficiently dispersing scattering particles (titanium oxide particles) having an average diameter of approximately 200 nm in a sol-gel coating solution including tetramethoxy silane as a condensable silane. A light scattering layer was formed to have a thickness of approximately 300 nm by coating the coating solution on a glass substrate, and performing a sol-gel reaction at 200° C.

for approximately 30 minutes. Afterward, a planarized layer (high refractive layer) having a refractive index of approximately 1.88 was formed by coating a high refractive coating solution (binder:titanium oxide particles=4:6 (weight ratio)) prepared by blending rutile-type high refractive titanium oxide particles having an average diameter of approximately 10 nm and a refractive index of approximately 2.6 in the sol-gel coating solution including tetramethoxy silane in the same manner as described above on the top of the scattering layer, and performing a sol-gel reaction in the same manner as described above. Subsequently, the light scattering layer and the planarized layer were partially removed by radiating a laser to the formed layer such that positions of the remaining light scattering layer and the planarized layer corresponded to an emitting region of an organic layer to be subsequently formed. After the removal, a hole injection electrode layer including ITO was formed on the entire surface of the glass substrate to have a predetermined thickness by a known sputtering method. Subsequently, an organic layer capable of emitting white light was formed on the ITO layer by known material and method, and an aluminum (Al) electrode was also formed on the top of the organic layer by a vacuum deposition method as an electron injection reflective electrode, thereby manufacturing a device. External quantum efficiency (light extraction efficiency) measured with respect to the manufactured device was approximately 51.4%.

Example 2

A substrate for an OED and an organic electronic system were manufactured as described in Example 1, except that a planarized layer (high refractive layer) having a refractive index of approximately 1.93 was formed using a high refractive coating solution (binder:titanium oxide particles=5:5 (weight ratio)) prepared using a binder having a refractive index of approximately 1.7 to 1.8, which was poly(amic acid) synthesized by a known method of synthesizing poly(amic acid) using a compound of Formula A (3,3'-sulfonyldianiline) and a compound of Formula B (3,3', 4,4'-bipheynyltetracarboxylic dianhydride) instead of a tetramethoxy silane binder. External quantum efficiency (light extraction efficiency) measured with respect to the manufactured device in the same manner as in Example 1 was approximately 54.5%.

[Formula A]

[Formula B]

Comparative Example 1

A substrate for an OED and an organic electronic system were manufactured as described in Example 1, except that a planarized layer (high refractive layer) having a refractive index of approximately 1.85 was formed using a high refractive coating solution (binder:titanium oxide particles=2:8 (weight ratio)) prepared by blending anatase-type high refractive titanium oxide particles having an average diameter of approximately 10 nm and a refractive index of approximately 2.2 in a sol-gel coating solution. External quantum efficiency (light extraction efficiency) measured with respect to the manufactured device in the same manner as in Example 1 was approximately 47.4%.

Experimental Example 1

Measurement of Emitting State

Figure 10:
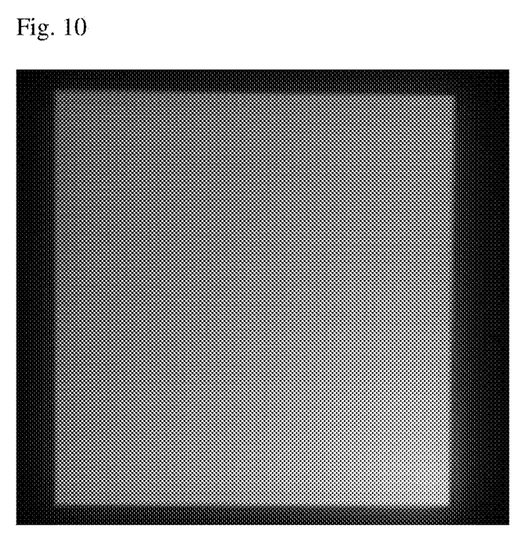
FIGS. 10 and 11 show emitting states of organic electronic systems according to Examples 1 and 2.
Figure 11:
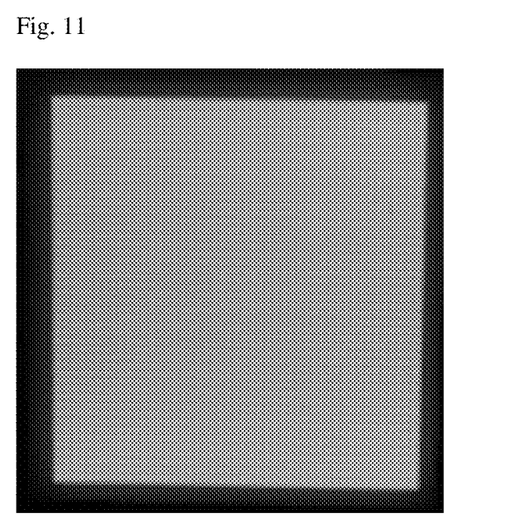
Figure 12:
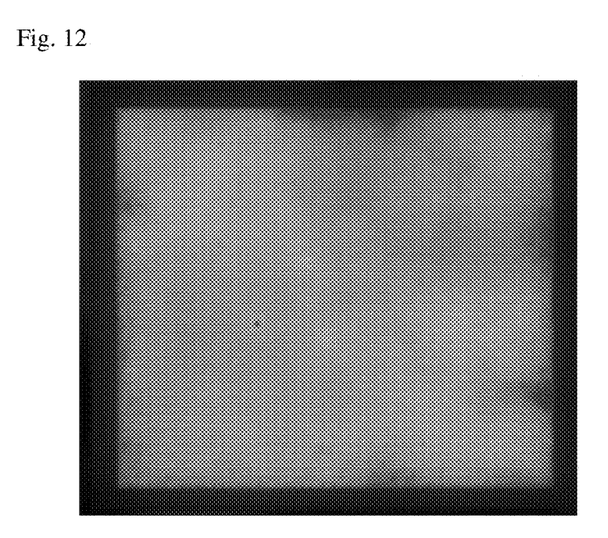
FIG. 12 shows an emitting state of an organic electronic system according to Comparative Example 1.

FIGS. 10 and 11 show emitting states of the organic electronic systems according to Examples 1 and 2, respectively, and FIG. 12 shows an emitting state of the organic electronic system according to Comparative Example 1. In Comparative Example 1, from the drawings, many dot spots were observed, and thus it was confirmed that reliability of the device was considerably degraded.

What is claimed is:
1. An organic electronic device, comprising:
a substrate; and
a first electrode layer, an organic layer comprising an emitting layer, and a second electrode layer, which are sequentially formed on the substrate;
wherein the substrate comprises:
a base layer;
a high refractive layer that is on the base layer, that comprises a binder, of which a refractive index is 1.4 or more, and that comprises a particle, of which a refractive index is more than 2.3 in an amount of 300 parts by weight or less, relative to 100 parts by weight of the binder; and
a scattering layer between the base layer and the high refractive layer; and
wherein the high refractive layer has a smaller projected area than that of the first electrode layer, and the first electrode layer is formed on both of the high refractive layer and the base layer in which the high refractive layer is not formed.
2. The organic electronic device of claim 1, wherein the maximum height roughness of a surface, that is opposite to a surface contacting with the base layer, of the high refractive layer is 1 µm or less.
3. The organic electronic device of claim 1, wherein the high refractive layer has a refractive index in the range from 1.8 to 2.5.
4. The organic electronic device of claim 1, wherein a refractive index of the binder is 1.4 or more and also less than 1.7.
5. The organic electronic device of claim 4, wherein the high refractive layer comprises the particles in an amount of 180 to 200 parts by weight, relative to 100 parts by weight of the binder.
6. The organic electronic device of claim 1, wherein the binder has a refractive index in the range from 1.7 to 2.0.
7. The organic electronic device of claim 6, wherein the high refractive layer comprises the particles in an amount of 80 to 150 parts by weight, relative to 100 parts by weight of the binder.
8. The organic electronic device of claim 1, wherein the binder is polysiloxane, poly(amic acid) or polyimide.

9. The organic electronic device of claim 1, wherein the particles have an average diameter in the range from 1 nm to 50 nm.

10. The organic electronic device of claim 1, wherein the particle is a rutile titanium oxide.

11. The organic electronic device of claim 1, wherein the high refractive layer further comprises a particle, of which a refractive index in from 2.0 to 2.3.

12. The organic electronic device of claim 11, wherein the particle, of which a refractive index is from 2.0 to 2.3, is anatase titanium oxide.

13. The organic electronic device of claim 11, wherein a ratio (AB) of a weight (A) of the particle, of which a refractive index is more than 2.3, and a weight (B) of the particle, of which a refractive index is from 2.0 to 2.3, is from 0.5 to 1.5.

14. Lighting comprising the organic electronic device of claim 1.

15. A substrate for an organic electronic device, comprising:
- a base layer;
- a high refractive layer that is on the base layer, that comprises a binder, of which a refractive index is 1.4 or more, and that comprises a particle, of which a refractive index is more than 2.3 in an amount of 300 parts by weight or less, relative to 100 parts by weight of the binder;
- a scattering layer between the base layer and the high refractive layer; and
- an electrode layer formed on the high refractive layer;
- wherein the high refractive layer has a smaller projected area than that of the electrode layer, and the electrode layer is formed on both of the high refractive layer and the base layer, below which the high refractive layer is not formed.

* * * * *